United States Patent
Huber et al.

(10) Patent No.: US 12,532,748 B2
(45) Date of Patent: Jan. 20, 2026

(54) SEMICONDUCTOR SUBSTRATE HAVING AN ALIGNMENT STRUCTURE

(71) Applicant: Infineon Technologies AG, Neubiberg (DE)

(72) Inventors: Thomas Huber, Ossiach (AT); Matthias Kuenle, Villach (AT); Iris Moder, Villach (AT); Joerg Ortner, Drobollach am Faakersee (AT)

(73) Assignee: Infineon Technologies AG, Neubiberg (DE)

( * ) Notice: Subject to any disclaimer, the term of this patent is extended or adjusted under 35 U.S.C. 154(b) by 439 days.

(21) Appl. No.: 18/109,616

(22) Filed: Feb. 14, 2023

(65) Prior Publication Data
US 2023/0275033 A1    Aug. 31, 2023

(30) Foreign Application Priority Data

Feb. 25, 2022   (DE) .......................... 102022104581.1

(51) Int. Cl.
*H01L 23/544*    (2006.01)
(52) U.S. Cl.
CPC .. *H01L 23/544* (2013.01); *H01L 2223/54426* (2013.01)
(58) Field of Classification Search
CPC ... H01L 2221/68309; H01L 2224/0213; H01L 2224/0217; H01L 2224/0224; H01L 2224/10135; H01L 2224/10165; H01L 2224/26135; H01L 2224/26165; H01L 2224/40993; H01L 2224/40998; H01L 2224/48993; H01L 2224/18998; H01L 2225/06593; H01L 2223/54426; H01L 23/544; B81C 99/007
See application file for complete search history.

(56) References Cited

U.S. PATENT DOCUMENTS

| | | | |
|---|---|---|---|
| 8,435,865 B2 | 5/2013 | Kodama | |
| 9,711,357 B1 | 7/2017 | Weber et al. | |
| 2017/0221988 A1* | 8/2017 | Baumgartl | H01L 21/0243 |
| 2018/0061772 A1* | 3/2018 | Lavanga | H01L 21/02658 |
| 2019/0157399 A1* | 5/2019 | Kosugi | H10D 62/81 |

FOREIGN PATENT DOCUMENTS

| | | |
|---|---|---|
| CN | 102891135 A | 1/2013 |
| DE | 102015122828 A1 | 6/2017 |
| DE | 102017113864 A1 | 12/2018 |

* cited by examiner

*Primary Examiner* — Christine S. Kim
*Assistant Examiner* — Cole Leon Lindsey
(74) *Attorney, Agent, or Firm* — Murphy, Bilak & Homiller, PLLC

(57) ABSTRACT

A semiconductor substrate includes a semiconductor base substrate. An alignment structure is formed on a surface of the semiconductor base substrate. An epitaxial layer is deposited on the surface of the semiconductor base substrate. The alignment structure includes an area of the surface of the semiconductor base substrate that is formed as a groove pattern. Grooves of the groove pattern are aligned with a specific crystallographic direction of the semiconductor base substrate. The specific crystallographic direction provides for a slower epitaxial growth rate on such a groove-patterned base substrate surface area compared to epitaxial growth on a surface of the semiconductor base substrate adjacent to the groove-patterned area.

23 Claims, 6 Drawing Sheets

SEMICONDUCTOR SUBSTRATE HAVING AN ALIGNMENT STRUCTURE

TECHNICAL FIELD

This disclosure relates to the field of semiconductor substrate processing, and in particular to the technique of manufacturing a semiconductor substrate having an alignment structure.

BACKGROUND

The fabrication of semiconductor devices typically comprises a sequence of photolithography steps. Alignment structures are necessary to align different lithographic layers in production. These alignment structures are blurred by epitaxial processes or deteriorate to an extent that optical alignment mark recognition becomes more and more inaccurate or fails. Known alignment mark designs feature trench-like blocks with limited width, as wider trenches lead to unwanted black silicon upon etch. Narrow standard mark designs tend to vanish even easier when overgrown by thick epitaxial layers.

SUMMARY

According to an aspect of the disclosure a semiconductor substrate includes a semiconductor base substrate. An alignment structure is formed on a surface of the semiconductor base substrate. An epitaxial layer is deposited on the surface of the semiconductor base substrate. The alignment structure comprises an area of the surface of the semiconductor base substrate that is formed as a groove pattern. The grooves are aligned with a specific crystallographic direction of the semiconductor base substrate. The specific crystallographic direction provides for a slower epitaxial growth rate on such a groove-patterned base substrate surface area compared to the epitaxial growth on a surface of the semiconductor base substrate adjacent to the area.

According to an aspect of the disclosure a method of manufacturing a semiconductor substrate comprises providing a semiconductor base substrate. An alignment structure is formed on a surface of the semiconductor base substrate by forming a groove pattern in an area of the surface of the semiconductor base substrate. The grooves are aligned with a specific crystallographic direction of the semiconductor base substrate. The specific crystallographic direction provides for a slower epitaxial growth on such a groove-patterned base substrate surface area compared to the epitaxial growth on a surface of the semiconductor base substrate adjacent to the area. An epitaxial layer is deposited on the surface of the semiconductor base substrate.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

The words "over" or "beneath" and similar words with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" and similar words used with regard to a part, element or material layer formed or located "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

During many stages of semiconductor processing and semiconductor device manufacturing, proper alignment of the semiconductor substrate, e.g. wafer, is of importance. To this end, optical elements, also known as alignment structures, are provided on the semiconductor substrate. The term alignment structure used herein includes all kinds of alignment marks such as, e.g., scribe line marks for aligning the semiconductor substrate during various manufacturing processes (e.g. lithography, layering, patterning, ion implant etc.) and metrology marks used during wafer inspection or wafer metrology.

The alignment structures may degrade as the semiconductor substrate goes through various processes. In particular, they become buried underneath epitaxial layers or films. Therefore, they become visible in less quality and may be detectable in less accuracy, so that the alignment structures may need to be refreshed several times during the manufacturing process. Nevertheless, the blurring of the alignment structures can severely reduce process stability and device quality.

Figure 1A:
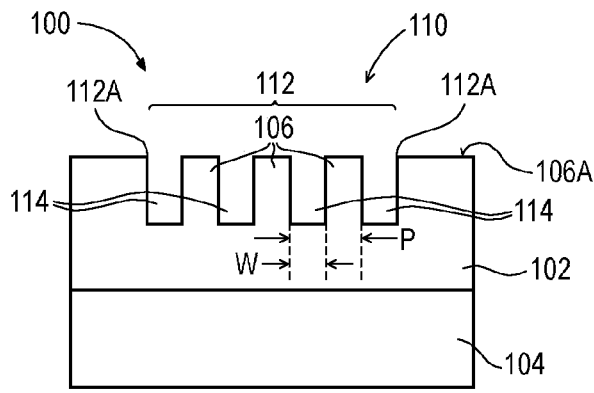
FIG. 1A is a schematic cross-sectional view of an exemplary semiconductor substrate with an exemplary trench type alignment structure.

FIG. 1A illustrates an example of a semiconductor substrate 100 with an exemplary trench type alignment structure 110. The semiconductor substrate 100 includes a semiconductor base substrate 102. The semiconductor base substrate 102 (in the following referred to as base substrate 102) can be a bulk semiconductor substrate or can be an epitaxial layer formed over a bulk substrate. In FIG. 1A, without loss of generality, the base substrate 102 is exemplified by an epitaxial layer formed on a bulk substrate 104.

The base substrate 102 (epitaxial layer or bulk substrate 104) can include any crystalline semiconductor material suitable for manufacturing semiconductor devices, and in particular can include any material suitable for epitaxial growth. Exemplary materials for the base substrate 102 include silicon (Si) and group IV compound semiconductor materials such as silicon carbide (SiC) or silicon germanium (SiGe). Alternatively, the base substrate 102 can include type III-V semiconductor materials including gallium nitride (GaN), gallium arsenide (GaAs), aluminum nitride (AlN), aluminum arsenide (AlAs), indium nitride (InN), indium arsenide (InAs), etc.

The bulk substrate 104 may e.g. form the base substrate 102 and can, therefore, include the same materials as mentioned above. If the base substrate 102 is formed by an epitaxial layer grown on or over the bulk substrate 104, the materials of the bulk substrate 104 and of the base substrate (epitaxial layer) 102 may include the same materials or the base substrate (epitaxial layer) 102 may include a material different from the material of the bulk substrate 104 and suitable for epitaxial growth on the material of the bulk substrate 104.

The surface 106A of the base substrate 102 represents the main lateral surface of the base substrate 102 (e.g. wafer). The alignment structure 110 includes an area 112 of the surface 106 of the base substrate 102 that is formed as a groove pattern. In the trench type alignment structure 110 of FIG. 1A, the grooves of the groove pattern are trenches 114 recessed for example by etching e.g. into the main lateral surface 106A of the base substrate 102.

Figure 1B:
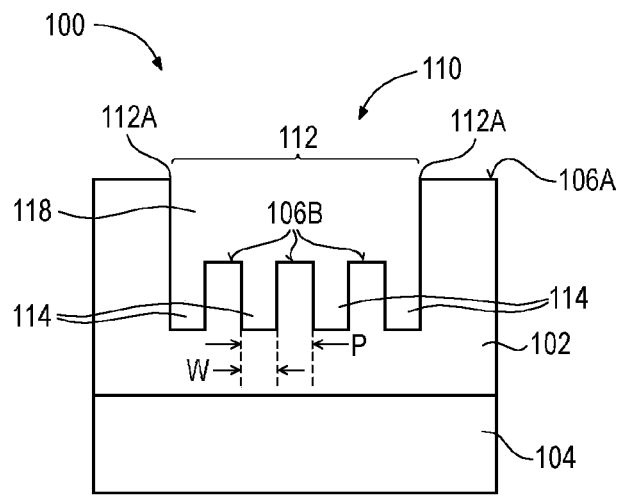
FIG. 1B is a schematic cross-sectional view of an exemplary semiconductor substrate with an exemplary trench type alignment structure arranged at a bottom of a recess.

As shown in FIG. 1B, the groove-patterned area 112 of the surface 106 of the base substrate 102 may extend over a part or an entirety of a bottom of a recess 118 (depression) in the semiconductor base substrate 102. In this case, the trenches 114 are recessed into the bottom 106B of the recess 118.

Differently stated, the trenches 114 may, e.g., be recessed into the main lateral surface 106A of the base substrate 102 (see FIG. 1A) or may be recessed into a surface area 112 of the base substrate 102 which forms a part or the entirety of the bottom 106B of the recess 118, i.e. is at a lower level than the main surface 106A of the semiconductor base substrate 102.

Figure 2:
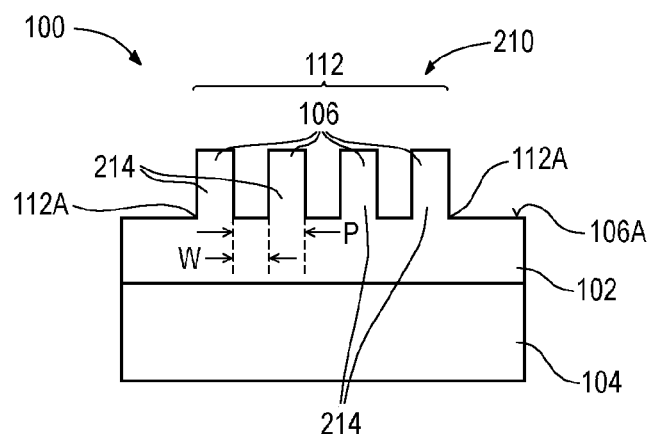
FIG. 2 is a schematic cross-sectional view of an exemplary semiconductor substrate with an exemplary ridge type alignment structure.

While in the trench type groove pattern as illustrated in FIGS. 1A and 1B, the grooves extend into the base substrate 102, in a ridge type alignment structure 210 as illustrated e.g. in FIG. 2, the grooves are formed by spacings between ridges 214 which extend away from the main surface 106A of the base substrate 102. Again, an area 112 of the surface 106 of the base substrate 102 is formed as a groove pattern. The ridge type alignment structure 210 may also be referred to as mesa type alignment structure.

That is, the groove pattern may be formed by trenches 114 extending into the base substrate 102 relative to the main surface 106A of the base substrate 102 or relative to a bottom surface 106B of a recess 118 in the base substrate, or may be formed between ridges 214 protruding from the base substrate 102 relative to the main surface 106A of the base substrate 102. In all groove patterns (trench type or ridge type) the side walls of the grooves may be perpendicular to the main surface 106A of the base substrate 102. Further, all (longitudinal) side walls may be parallel to each other. That is, the trenches 114 and/or the ridges 214 may have a constant width or spacing along their longitudinal extension. In other words, all trenches 114 or ridges 214 may be parallel to each other.

FIGS. 1A, 1B and 2 illustrate first outline portions 112A of the groove-patterned area 112. The first outline portions 112A may be defined by the transition from the surface 106 of the base substrate 102 which is groove-patterned (i.e. the groove-patterned area 112) and the main surface 106A of the base substrate 102. As will be described in more detail below, the first outline portions 112A of the groove-patterned area 112 may be parallel or oblique to the side walls of the grooves.

The grooves of the groove pattern may have a width W in a range between 50 nm and 5 µm. For example, the width W may be equal to or greater than or less than 100 nm, 500 nm, 1 µm, 2 µm or 4 µm.

The groove pattern may have a pitch P in a range between 100 nm and 10 µm. For example, the pitch P may be equal to or greater than or less than 200 nm, 800 nm, 2 µm, 4 µm or 8 µm.

The grooves of the groove pattern may have a depth in a range between 100 nm and 10 µm. For example, the depth may be equal to or greater than or less than 1 µm, 2.5 µm, 5 µm or 7.5 µm. The depth of the grooves corresponds to the depth of the trenches 114 (FIGS. 1A-1B) or the height of the ridges 214 (FIG. 2).

Figure 4A:
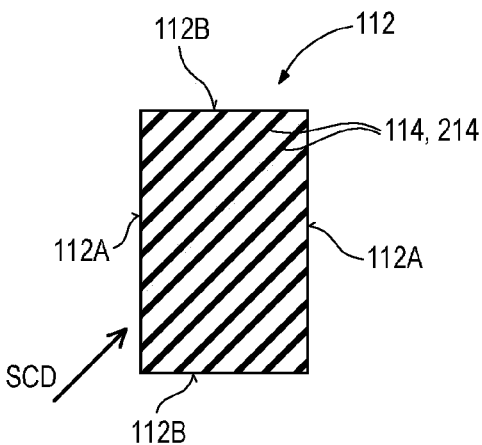
FIG. 4A is a schematic top view of a groove pattern of an exemplary alignment structure.

FIG. 4A illustrates a top view of a groove pattern formed in the area 112 of the surface 106 (e.g. 106A, 106B) of the base substrate 102. The area 112 is defined by the e.g. parallel first outline portions 112A and by the e.g. parallel second outline portions 112B which are oriented perpendicular to the first outline portions 112A. In the example of FIG. 4A the direction of the outline portions 112A is oblique to the direction of the grooves of the groove pattern which may, e.g., be of the trench type or ridge type. However, in other examples the direction of the grooves may be parallel or perpendicular with the direction of the first outline portion 112A (see FIG. 11).

Figure 4B:
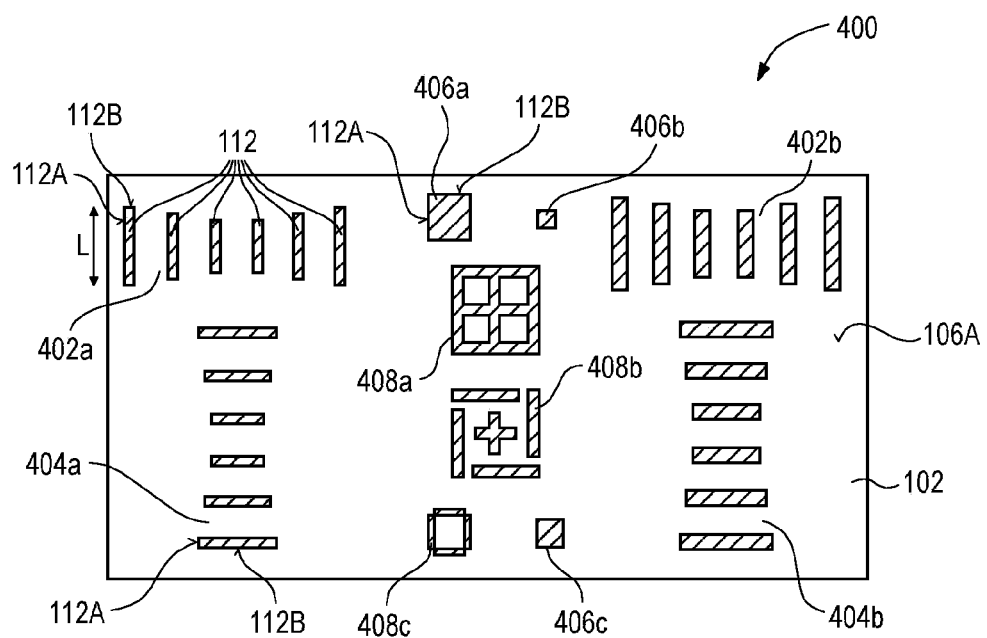
FIG. 4B is a schematic top view of various alignment structures having different outlines.

FIG. 4B illustrates a variety of examples of different alignment structures 400. The alignment structures 402a, 402b, 404a, 404b each include a plurality of bars. Each bar may correspond to a groove-patterned area 112 of the surface 106 (e.g. main surface 106A or bottom surface 106B) of the base substrate 102. The bars of the plurality of bars are parallel to each other.

In the alignment structures 402a, 402b, 404a, 404b only the longitudinal outline portions 112A of the bars may be used for optical recognition. Such alignment structures may also be termed one-dimensional alignment structures. L refers to the length of the outline portion 112A of such groove-patterned area 112. In other examples the alignment structure 400 may be a two-dimensional alignment structure. For example, alignment structure 402a and alignment structure 404a together establish a two-dimensional alignment structure. Analogously, the alignment structures 402b and 404b together feature a two-dimensional alignment structure. Other two-dimensional alignment structures are represented by alignment structures 406a, 406b, 406c, which have a quadratic shape. Further, alignment structures 400 may have an arbitrary shape which is composed of quadratic or bar-shaped or cross-shaped groove-patterned areas 112, as exemplarily illustrated by alignment structures 408a, 408b, 408c.

The alignment structures 400 shown in FIG. 4B are all formed by one or more groove-patterned areas 112 of the surface 106 (e.g. 106A or 106B) of the base substrate 102. Hence, these areas may, e.g., be bar-shaped (see e.g. 402a, 402b, 404a, 404b) or square-shaped (see e.g. 406a, 406b, 406c) or cross-shaped (see e.g. 408a). However, it is also possible that the groove-patterned area 112 has a shape inverse to a bar or a cross or a square. In this case, the bars or squares or crosses of FIG. 4B are not patterned (or e.g. patterned in a different direction) while an area surrounding these structures is groove-patterned.

Figure 3:
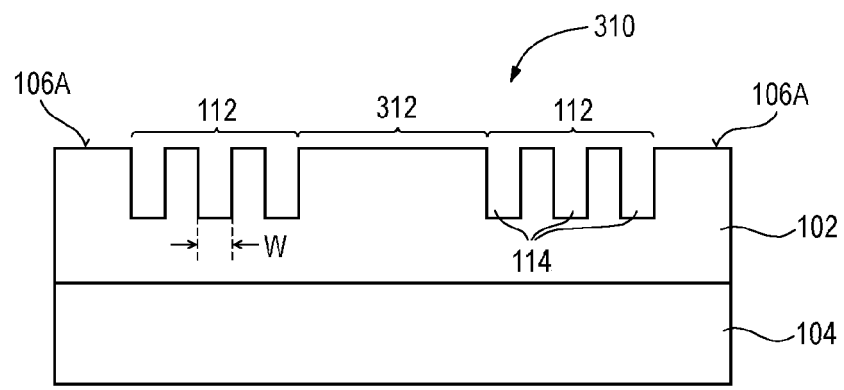
FIG. 3 is a schematic cross-sectional view of an exemplary semiconductor substrate with an exemplary trench type inverse alignment structure.

FIG. 3 illustrates a cross-sectional view of such "inverse" alignment structure 310. A central area 312 of the alignment structure 310 is not patterned and bordered by adjacent areas 112 which are patterned. The central not patterned area 312 may be bar-shaped or cross-shaped or square-shaped or composed of arbitrary combinations of such shapes, i.e. may have, e.g., the shape of any of the exemplary alignment structures 400 of FIG. 4B.

In FIG. 3 the groove-patterned areas 112 are of the trench type (here for example depicted without recess in accordance with FIG. 1A). However, in other examples the groove-patterned areas 112 of the "inverse" alignment structure 310 of FIG. 3 may be of the ridge type, see FIG. 2.

In all embodiments described herein, the grooves are aligned (i.e. oriented) with a specific crystallographic direction of the semiconductor material of the base substrate 102. In FIG. 4A this specific crystallographic direction is indicated by arrow SCD. Grooves aligned in the specific crystallographic direction SCD provide a slower epitaxial growth rate on such a groove-patterned surface area 112 of the base substrate 102 compared to epitaxial growth on a surface 106A of the base substrate 102 that is adjacent to (and not grooved or grooved in a different direction than) the groove-patterned area 112.

For example, the specific crystallographic direction SCD may provide for the slowest epitaxial growth rate among all crystallographic directions on such a groove-patterned area 112 of the surface 106 of the base substrate 102.

FIGS. 5A-5D illustrate the exemplary semiconductor substrate 100 of FIGS. 1A, 1B, 2, 3, respectively, with an epitaxial layer 510 grown over the alignment structures 110, 210, 310. As illustrated in FIGS. 5A-5D, the thickness of the epitaxial layer 510 in the groove-patterned area 112 is substantially smaller than the thickness of the epitaxial layer 510 adjacent to the groove-patterned area 112.

The reduction in thickness of the epitaxial layer 510 in the groove-patterned area 112 is due to the fact that the epitaxial growth on a groove-patterned surface of the base substrate 102 depends on the orientation of the grooves in respect to a crystallographic direction. In accordance with the disclosure, the grooves are aligned (i.e. oriented) with a specific crystallographic direction (SCD) which provides for a slow epitaxial growth rate which is, at least, slower than the epitaxial growth rate at the surface adjacent to the alignment structure 110, 210, 310. For example, the surface adjacent to the alignment structure 110, 210, 310 may be the unpatterned surface or the surface patterned in a different direction than the SCD. In particular, the SCD may be the crystallographic direction resulting in minimum epitaxial growth rate.

FIGS. 5A-5D illustrate the exemplary semiconductor substrate 100 of FIGS. 1A, 1B, 2, 3, respectively, with an epitaxial layer 510 grown over the alignment structures 110, 210, 310. In all examples side wall edges 520 are formed in the epitaxial layer 510 over the alignment structures 110, 210. The side wall edges 520 are caused (FIGS. 5A, 5C, 5D) or enhanced (FIG. 5B) by the slower epitaxial growth over the groove-patterned area 112 during the deposition of the epitaxial layer 510. The side wall edges 520 of the epitaxial layer 510 are parallel to the first outline portions 112A of groove-patterned areas 112. The side wall edges 520 are typically used for optical recognition of the alignment structures 110, 210.

Figure 5A:
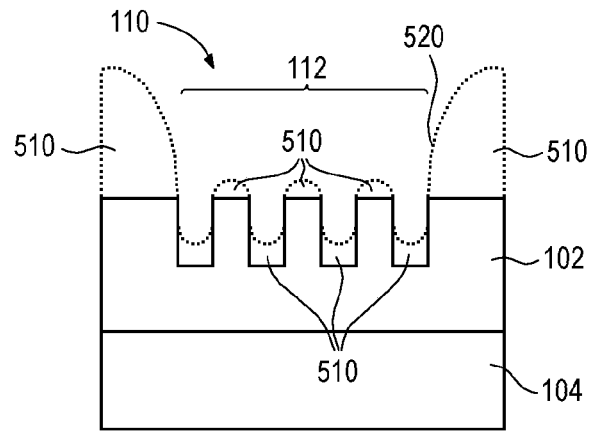
FIGS. 5A-5D are schematic cross-sectional views of the exemplary semiconductor substrates of FIGS. 1A-1B, 2, 3 with an epitaxial layer grown over the alignment structures.
Figure 5B:
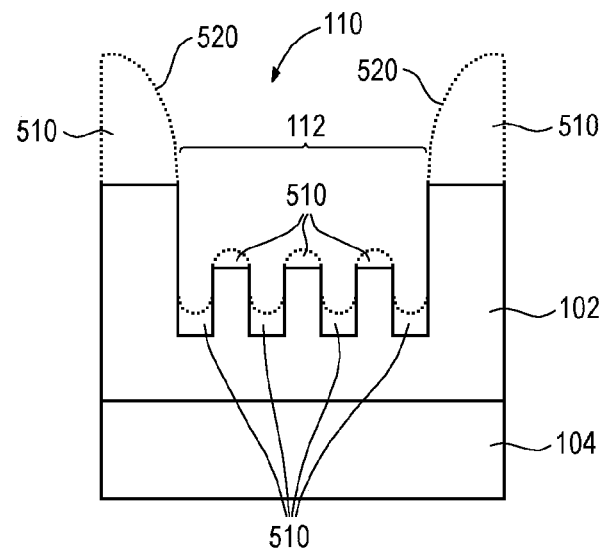
Figure 5C:
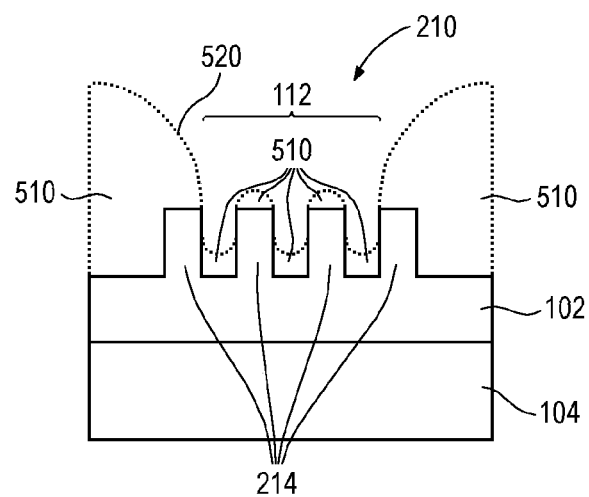
Figure 5D:
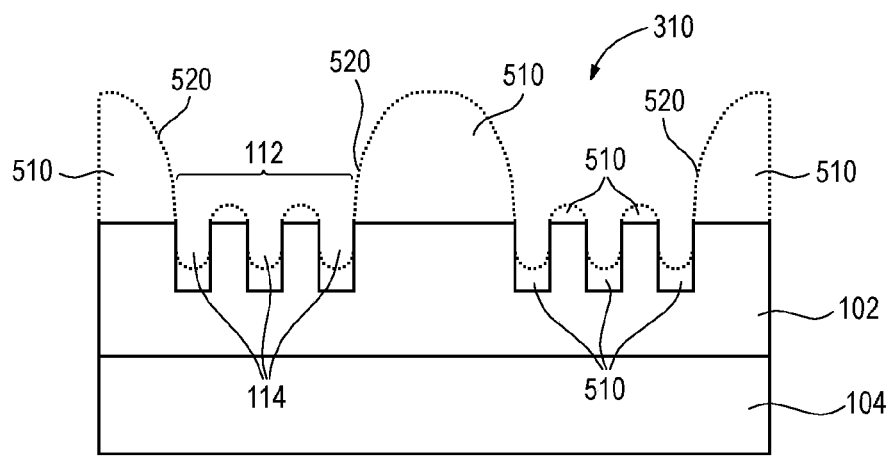

Conventional alignment marks are formed by one or more recesses, wherein the side walls of each recess are used as an optical recognition feature for alignment. Therefore, conventional processes for maintaining the alignment mark visible during subsequent layering try to preserve the outer edge and/or the side wall direction of the alignment mark. The approach disclosed herein, in contrast, relies on affecting the growth process by providing the area 112 within the alignment structure with a groove pattern or "fine structure" which, due to its specific orientation relative to the crystallographic lattice, impedes or slows down epitaxial growth. As a result, the edges of the alignment structure (which is what matters in mark recognition) are preserved or enlarged or even generated along the outline portions 112A, 112B of the groove-patterned area 112. As illustrated in FIGS. 5A, 5C and 5D, the alignment structure (trench type 110 or ridge type 210) does not need to be located in a recess having side walls as, e.g., exemplified in FIG. 5B. Rather, the feature for mark recognition may, e.g., exclusively be formed by the epitaxial layer 510 (which, conventionally, levels the recess and therefore deteriorates the alignment structure). In other words, the concept of providing a base substrate 102 with a groove-patterned area 112 does not only allow to preserve a pre-existing alignment structure (e.g. recess, depression) but may also be used to create a visually recognizable alignment feature.

The pitch P of the groove pattern is substantially smaller than the dimensions of the outline portions 112A, 112B of the groove-patterned area 112. More specifically, a ratio of the length L of an outline portion 112A, 112B and the pitch P of the groove pattern may, e.g., be equal to or greater than 5, 10, 50, 100 or 200. A ratio of the length L of an outline portion 112A, 112B and the width W of a groove of the groove pattern may, e.g., be equal to or greater than 10, 20, 100, 200 or 400.

The groove pattern may, e.g., be a regular groove pattern with, e.g., constant P and/or constant W across a part or the entirety of the groove-patterned area 112. Further, all grooves of a part or the entirety of the groove-patterned area 112 may be aligned parallel to each other.

Figure 6:
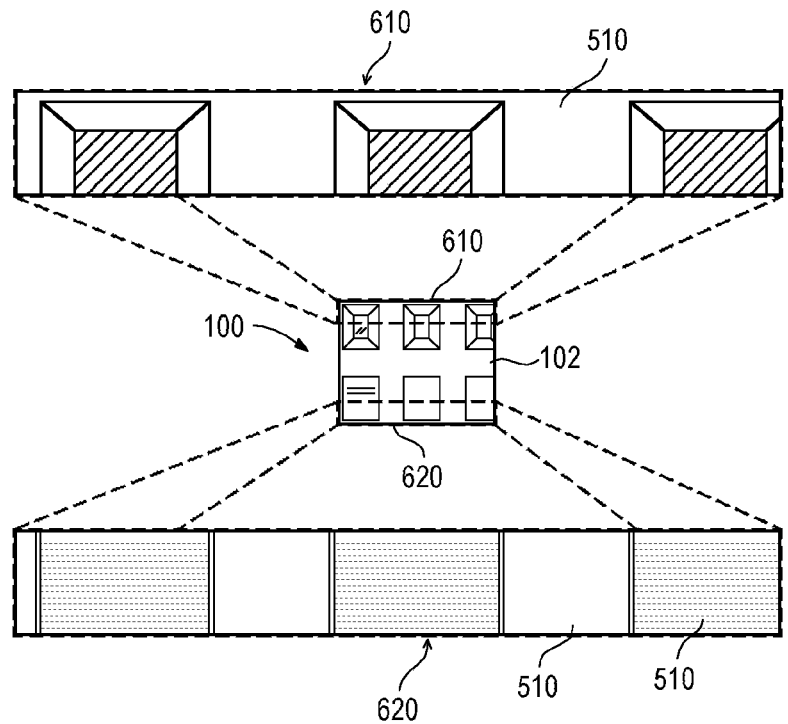
FIG. 6 shows a contour-traced top view scanning electron microscope (SEM) image of an epitaxial layer grown on an exemplary alignment structure according to the disclosure and an alignment structure with grooves oriented in a different direction, and partial magnifications of the image.

FIG. 6 shows a contour-traced SEM image of a semiconductor substrate 100 including a base substrate 102 with two rows (upper row 610 and lower row 620) of three groove-patterned surface areas, respectively, and an epitaxial layer 510 deposited on the base substrate 102. The contour-traced SEM image is true-to-scale. In this example, the base substrate 102 is of silicon. The groove-patterned surface areas are each provided with a trench type groove pattern, compare FIG. 1A. The orientation of the grooves in the upper row 610 is in the crystallographic direction (011) of the cubic Si lattice. In the lower row 620 the groove pattern is aligned in the (010) crystallographic direction.

As apparent from FIG. 6, the groove-patterned surface areas 112 of the upper row 610 were well preserved. After epitaxial layer deposition, the built-up side walls of the epitaxial layer 510 are easily detectable by optical recognition. On the other hand, the groove-patterned surface areas of the lower row 620 are completely covered by epitaxial material. Side walls generated by the epitaxial process are hardly detectable by optical recognition. Also, the groove pattern is hardly visible at the surface of the epitaxial layer 510.

Hence, the same epitaxial layer process leads to very different epitaxial growth behavior depending on the orientation of the grooves. While the outlines of the groove-patterned areas 112 of the upper row 610 are very clearly visible under the optical microscope after the epitaxial layer deposition, the outlines of the groove-patterned areas of the lower row 620 are hardly visible under the optical microscope.

In the example of FIG. 6, the trenches of the groove pattern have a depth of 2.4 µm and a pitch of 0.35 µm. The outline length L of each recess is about 50 µm.

While the SEM of FIG. 6 relates to a trench type groove pattern 110 as illustrated in FIG. 1A, similar results are obtained for recessed trench type groove patterns (FIG. 1B), ridge type groove patterns 210 (FIG. 2) or inverse alignment structures 310 as shown in FIG. 3.

Even in the case that the grooves of the groove pattern are oriented in the direction of slower or slowest epitaxial growth, as illustrated in the upper row 610 of FIG. 6, it is possible that the grooves become overgrown by epitaxial material. From this point on the growth rate above the groove-patterned area and adjacent to the groove-patterned area is the same.

Figure 7:
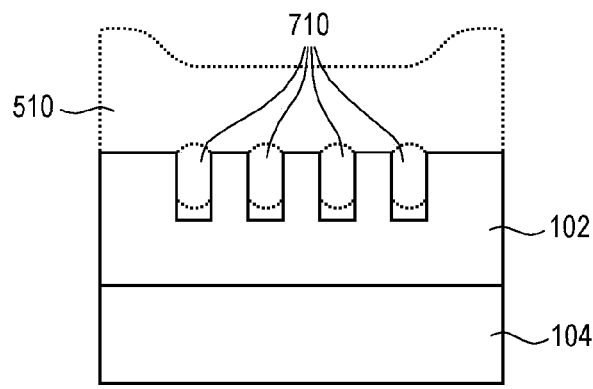
FIG. 7 is a schematic cross-sectional view of an exemplary semiconductor substrate with voids remaining in the grooves covered by the epitaxial layer.

When becoming overgrown, according to one possibility, the grooves may be completely filled with the epitaxial material. According to another possibility, voids may remain in the grooves covered by the epitaxial layer. This situation is illustrated in FIG. 7. The pattern of voids 710 provide for a grating which forms an (additional) buried alignment mark. Differently stated, the grating can be used as an additional alignment feature, which can be combined with the alignment feature provided by the side wall edges 520 of epitaxial layer 510. The grating formed by the pattern of voids 710 can be recognized by through-silicon alignment (TSA) tools. TSA tools use infrared (IR) light of a wavelength of, e.g., about 1 µm to directly detect the fine structure (grating) formed by the pattern of voids 710.

The grating (pattern of voids 710) provides for additional optical information on the alignment structure (e.g. of the trench type 110 or of the ridge type 210). The advantage of this measure is that here the groove pattern (fine structure) is detected as such, i.e. the detection is independent on distortions on edge growth during the epitaxial process. Rather, the alignment structure 110, 210 remains detectable in its original form.

Whether the grooves are completely filled or voids 710 remain within the grooves can be controlled by process parameters of the epitaxial process and is further dependent on the dimensions (depth and width) of the grooves. Further, it also relies on the orientation of the grooves along the specific crystallographic direction, since this alignment of the grooves inhibits to some extent the filling of the grooves.

That is, while alignment structure detection by optical microscopy utilizes the surface topography of the epitaxial layer 510 e.g. at the edges 520 of the epitaxial layer 510 (which are better preserved or even generated by the groove-patterned area 112 during the epitaxial process), IR mark detection by TSA utilizes the contrast modulation or grating properties of the pattern of voids 710 that remain detectable under the epitaxial layer 510 inter alia due to their slowed growth behavior. In other words, IR mark detection may rely, in addition or alone, on the recognizing the groove pattern as such.

Figure 8:
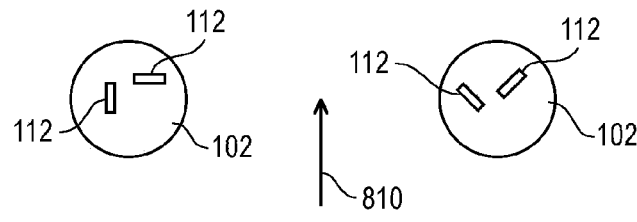
FIG. 8 is a schematic illustration of proper and improper alignment of an alignment structure in a processing or inspection tool.

Optical tools for alignment structure recognition can only detect alignment structure edges which are parallel or perpendicular to a tool-specific recognition direction. In FIG. 8 the tool-specific recognition direction is indicated by arrow 810. Consequently, the alignment structure edges of the left side alignment structures of groove-patterned areas 112 of FIG. 8 can be recognized, while the alignment structure edges of the right side alignment structures of FIG. 8 cannot be detected by the tool. Hence, this orientation of alignment is not accepted by the tool.

Figure 9:
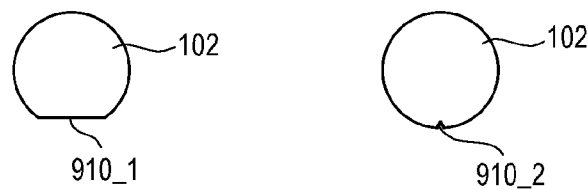
FIG. 9 shows schematic illustrations of wafers provided with features indicating a known reference crystallographic direction.

Each semiconductor base substrate 102 (e.g. wafer on which the epitaxial growth is performed) is provided with a feature indicating a known reference crystallographic direction. For example, the feature may be formed as a flat portion 910_1 of the periphery (i.e. edge) of the wafer (substrate 102) or may be formed as a notch 910_2 in the periphery of the wafer, see FIG. 9.

Figure 10:
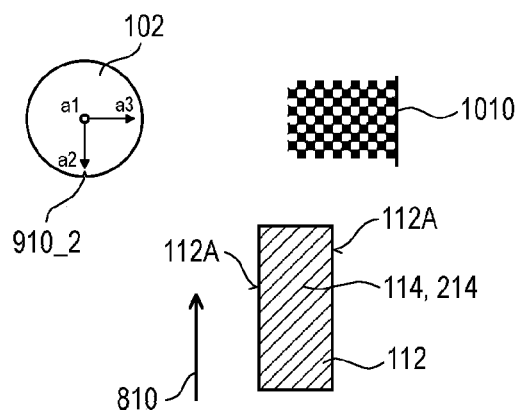
FIG. 10 is a schematic diagram illustrating a case where the direction of a linear outline portion of the alignment structure is parallel to the reference crystallographic direction and oblique to the specific crystallographic direction.

FIG. 10 illustrates a first example in which the reference crystallographic direction is ⟨010⟩ and the surface of the wafer (base substrate 102) is in the crystallographic plane (100). With respect to the base vectors a1, a2, a3 of the lattice unit cell as depicted in FIG. 10, a (vertical) side wall 1010 of an epitaxial layer deposited over the alignment structure 110 (compare side wall edges 520 of FIGS. 5A-5D) is in the crystallographic plane (001). This plane is parallel to the direction of the outline portion 112A of the grooved-patterned area 112.

In this example, the direction of the linear outline portion 112A is parallel with the reference crystallographic direction (indicated e.g. by notch 910_2) and is oblique to the specific crystallographic direction (011) with which the groove pattern is aligned. The wafer (base substrate 102) may be aligned in a tool as shown on the left side of FIG. 8.

Figure 11:
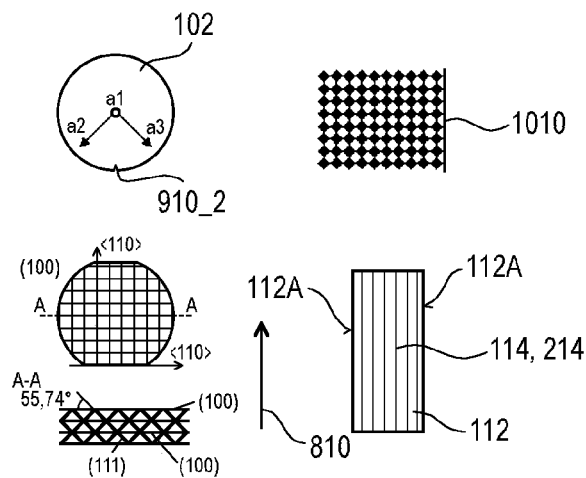
FIG. 11 is a schematic diagram illustrating a case where the direction of a linear outline portion of the alignment structure is parallel to the reference crystallographic direction and parallel to the specific crystallographic direction.

According to another example as shown in FIG. 11, the known reference crystallographic direction (indicated e.g. by notch 910_2) may, e.g., be in crystallographic direction (011) with respect to the base vectors a1, a2, a3 of the lattice unit cell as depicted in FIG. 11. Having for example again the surface of the base substrate 102 in the (100) crystallographic plane, the vertical side wall 1010 of the epitaxial layer deposited over the alignment structure 110 (compare side wall edges 520 of FIGS. 5A-5D) is in the crystallographic plane (0-11), which is equivalent to the crystallographic plane (011). This plane is parallel to the direction of the outline portion 112A of the grooved-patterned area 112.

Here, the direction of the linear outline portion 112A of the grooved-patterned area 112 is parallel with the reference crystallographic direction and is parallel with the groove pattern aligned with the specific crystallographic direction ⟨011⟩.

The examples of FIGS. 8 to 11 relate to a cubic crystal lattice, e.g. the silicon lattice. Further, the specific crystallographic direction (011) used by way of example in FIGS. 10 and 11 for groove pattern alignment is, among all crystallographic directions, the direction which provides for the slowest epitaxial growth on a correspondingly aligned groove-patterned area 112 in a cubic crystal lattice. For other crystal lattices the direction of slowest epitaxial growth (i.e. the optimum specific crystallographic direction) may be in other crystallographic directions.

Figure 12:
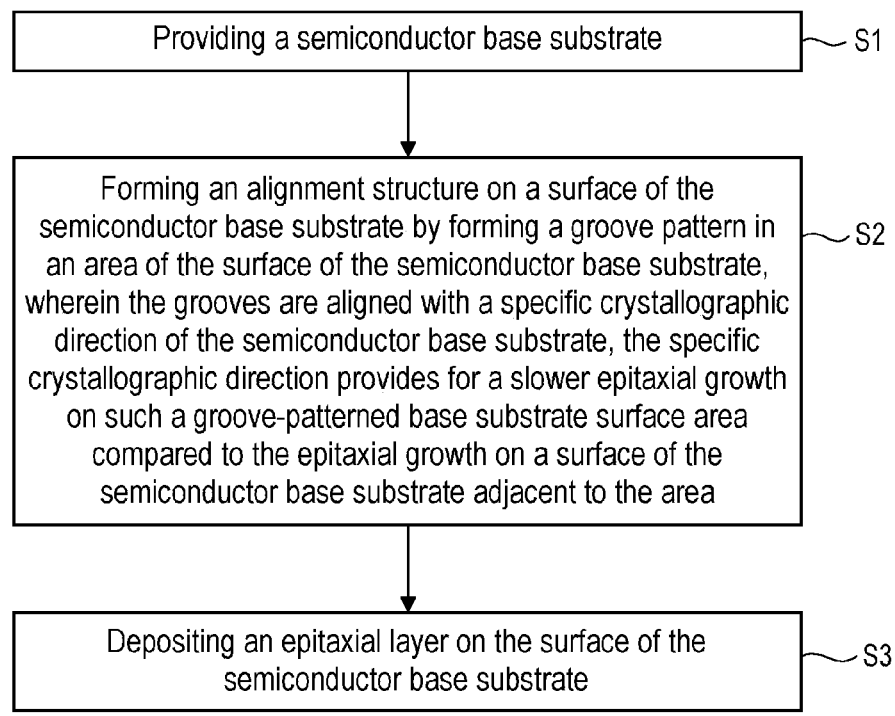
FIG. 12 is a flowchart illustrating stages of an exemplary method of manufacturing a semiconductor substrate.

Referring to FIG. 12, a method of manufacturing a semiconductor substrate may include, at S1, providing a semiconductor base substrate. The semiconductor base substrate may be a bulk semiconductor substrate or a bulk semiconductor substrate provided with one or more epitaxial layers.

At S2, an alignment structure is formed on a surface of the semiconductor base substrate by forming a groove pattern in an area of the surface of the semiconductor base substrate. The grooves are aligned with a specific crystallographic direction of the semiconductor base substrate. The specific crystallographic direction provides for a slower epitaxial growth on such a groove-patterned base substrate surface area compared to the epitaxial growth on a surface of the semiconductor base substrate adjacent to the area.

At S3, an epitaxial layer is deposited on the surface of the semiconductor base substrate.

The epitaxial layer may but does not need to be of the same material than the surface of the semiconductor base substrate. In other words, the process described herein is also applicable for hetero-epitaxial processes.

Further, the groove pattern may be formed of a material which is different from the material of the semiconductor base substrate at the main surface 106A thereof. For example, the ridges 214 (FIG. 2) may be formed by silicon oxide on a bulk substrate 104 or an epitaxial layer 102 of silicon. Analogously, the trenches 114 of FIG. 1B may be recessed in a material layer (e.g. silicon oxide) which is different from the material (e.g. silicon) of the bulk substrate 104 or the epitaxial layer 102.

The process described above may further include aligning a processing tool or an inspection tool with the alignment structure. The alignment may be based on illuminating the epitaxial layer over the alignment structure by visible light and recognizing side wall edges in the epitaxial layer over the alignment structure. The processing tool or the inspection tool may then be repositioned relative to the semiconductor substrate based on the recognized side wall edges.

As mentioned before, the alignment of the processing tool or inspection tool (e.g. for overlay measurement) may rely on evaluating visible light reflected by the side wall edges on the semiconductor substrate in view of difference in contrast and/or by evaluating infrared light diffracted by the groove pattern (e.g. by voids created in the groove pattern) of the alignment structure.

Aligning the processing tool may comprise repositioning a reticle or the semiconductor substrate in the processing tool.

In general alignment structures for e.g. lithography and/or metrology can be built using geometries that do not run into risk of generating black silicon. This reduces unnecessary process steps (lithography, alignment, etch, etc.) in production to renew alignment structures. By using the alignment structures disclosed herein, there are more degrees of freedom for the epitaxial deposition process, as long as the method described herein helps to preserve alignment and metrology marks under the chosen deposition conditions for the respective process block. The alignment structures described herein can most effectively be used for applying multiple and/or thick epitaxial layers. Similarly, the alignment structures can be used to reduce the amount of required process steps and/or layers. The epitaxial process can be optimized for device properties and is less restricted regarding conservation of alignment or metrology structures.

Further, advanced lithography tools are optionally equipped with dark field alignment mode. In combination with dark field illumination, the alignment structures disclosed herein are expected to show advantages, as recognition of alignment structures being built up as a trench array or ridge array might show good contrast for normal alignment scopes and might show even better contrast in the dark field mode.

The following examples pertain to further aspects of the disclosure:

Example 1 is a semiconductor substrate including a semiconductor base substrate. An alignment structure is formed on a surface of the semiconductor base substrate. An epitaxial layer is deposited on the surface of the semiconductor base substrate, wherein the alignment structure comprises an area of the surface of the semiconductor base substrate that is formed as a groove pattern. The grooves are aligned with a specific crystallographic direction of the semiconductor base substrate, and the specific crystallographic direction provides for a slower epitaxial growth rate on such a groove-patterned base substrate surface area compared to the epitaxial growth on a surface of the semiconductor base substrate adjacent to the area.

In Example 2, the subject matter of Example 1 can optionally include wherein the area of the surface of the semiconductor base substrate has an outline comprising linear first and linear second outline portions, the linear first and linear second outline portions being oriented perpendicular to each other.

In Example 3, the subject matter of Example 2 can optionally include wherein the area of the surface of the semiconductor base substrate extends over a part or an entirety of a bottom of a recess in the semiconductor base substrate, and at least one side wall or all side walls of the recess are defined by the outline of the area.

In Example 4, the subject matter of Example 2 or 3 can optionally include wherein the semiconductor base substrate is provided with a feature indicating a reference crystallographic direction, the reference crystallographic direction is for alignment of the semiconductor base substrate in a substrate processing tool, wherein the direction of the linear first outline portion is parallel with the reference crystallographic direction and oblique to the specific crystallographic direction.

In Example 5, the subject matter of Example 2 or 3 can optionally include wherein the semiconductor base substrate is provided with a feature indicating a reference crystallographic direction, the reference crystallographic direction is for alignment of the semiconductor base substrate in a substrate processing tool or a substrate inspection tool, wherein the direction of the linear first outline portion is parallel with the reference crystallographic direction and parallel with the specific crystallographic direction.

In Example 6, the subject matter of any of Examples 2 to 5 can optionally include wherein the area is bar-shaped or is cross-shaped or is square shaped or has a shape inverse to a bar or a cross or a square.

In Example 7, the subject matter of any of the preceding Examples can optionally include wherein the grooves of the groove pattern have a width in a range between 50 nm and 5 µm.

In Example 8, the subject matter of any of the preceding Examples can optionally include wherein the groove pattern has a pitch in a range between 100 nm and 10 µm.

In Example 9, the subject matter of any of the preceding Examples can optionally include wherein the grooves of the groove pattern have a depth in a range between 100 nm and 10 μm.

In Example 10, the subject matter of any of the preceding Examples can optionally include wherein the semiconductor substrate is a wafer.

In Example 11, the subject matter of any of the preceding Examples can optionally include wherein the grooves are completely filled by the epitaxial layer.

In Example 12, the subject matter of any of the Examples 1 to 10 can optionally include voids remaining in the grooves covered by the epitaxial layer.

In Example 13, the subject matter of any of the preceding Examples can optionally include wherein the surface of the semiconductor base substrate is formed by a surface of an epitaxial layer of the base substrate.

In Example 14, the subject matter of any of the preceding Examples can optionally include wherein the specific crystallographic direction, among all crystallographic directions, provides for the slowest epitaxial growth on such a groove-patterned base substrate surface area.

In Example 15, the subject matter of any of the preceding Examples can optionally include wherein the specific crystallographic direction in a cubic lattice is <011>.

In Example 16, the subject matter of any of the preceding Examples can optionally include wherein the semiconductor base substrate is of Si.

In Example 17, the subject matter of any of the Examples 1 to 14 can optionally include wherein the semiconductor base substrate is of SiC or GaN.

Example 18 is a method of manufacturing a semiconductor substrate, the method comprising providing a semiconductor base substrate; forming an alignment structure on a surface of the semiconductor base substrate by forming a groove pattern in an area of the surface of the semiconductor base substrate, wherein the grooves are aligned with a specific crystallographic direction of the semiconductor base substrate, the specific crystallographic direction provides for a slower epitaxial growth on such a groove-patterned base substrate surface area compared to the epitaxial growth on a surface of the semiconductor base substrate adjacent to the area; and depositing an epitaxial layer on the surface of the semiconductor base substrate.

In Example 19, the subject matter of Example 18 can optionally further include aligning a processing tool or an inspection tool with the alignment structure; and processing or inspecting the epitaxial layer and/or the semiconductor substrate with the processing tool or the inspection tool.

In Example 20, the subject matter of Example 19 can optionally further include wherein aligning the processing tool or the inspection tool comprises illuminating the epitaxial layer over the alignment structure by visible light; recognizing side wall edges in the epitaxial layer over the alignment structure, wherein the side wall edges are caused by the slower epitaxial growth over the groove-patterned area during the deposition of the epitaxial layer; and repositioning the processing tool or the inspection tool based on the recognized side wall edges.

In Example 21, the subject matter of Example 20 can optionally further include wherein recognizing side wall edges comprises evaluating light reflected by the side wall edges in view of differences in contrast.

In Example 22, the subject matter of any of Examples 19 to 21 can optionally further include wherein aligning the processing tool or the inspection tool comprises: illuminating the epitaxial layer over the alignment structure by infrared light; recognizing the groove pattern of the alignment structure; and repositioning the processing tool or the inspection tool based on the recognized groove pattern.

In Example 23, the subject matter of any of Examples 19 to 22 can optionally further include wherein aligning the processing tool comprises repositioning a reticle or the semiconductor substrate in the processing tool.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor substrate, comprising:
    a semiconductor base substrate;
    an alignment structure formed on a surface of the semiconductor base substrate; and
    an epitaxial layer deposited on the surface of the semiconductor base substrate,
    wherein the alignment structure comprises an area of the surface of the semiconductor base substrate that is formed as a groove pattern,
    wherein grooves of the groove pattern are aligned with a specific crystallographic direction of the semiconductor base substrate,
    wherein the specific crystallographic direction provides for a slower epitaxial growth rate on the area of the surface of the semiconductor base substrate formed as the groove pattern compared to epitaxial growth on a surface of the semiconductor base substrate adjacent to the area of the surface formed as the groove pattern.

2. The semiconductor substrate of claim 1, wherein the area of the surface of the semiconductor base substrate formed as the groove pattern has an outline comprising linear first and linear second outline portions, and wherein the linear first and linear second outline portions are oriented perpendicular to each other.

3. The semiconductor substrate of claim 2, wherein the area of the surface of the semiconductor base substrate formed as the groove pattern extends over a part or an entirety of a bottom of a recess in the semiconductor base substrate, and wherein at least one side wall or all side walls of the recess are defined by the outline of the area.

4. The semiconductor substrate of claim 2, wherein the semiconductor base substrate is provided with a feature indicating a reference crystallographic direction, wherein the reference crystallographic direction is for alignment of the semiconductor base substrate in a substrate processing tool, and wherein a direction of the linear first outline portion is parallel with the reference crystallographic direction and oblique to the specific crystallographic direction.

5. The semiconductor substrate of claim 2, wherein the semiconductor base substrate is provided with a feature indicating a reference crystallographic direction, wherein the reference crystallographic direction is for alignment of the semiconductor base substrate in a substrate processing tool or a substrate inspection tool, and wherein a direction of the linear first outline portion is parallel with the reference crystallographic direction and parallel with the specific crystallographic direction.

6. The semiconductor substrate of claim 2, wherein the area of the surface of the semiconductor base substrate formed as the groove pattern is bar-shaped or is cross-shaped or is square shaped or has a shape inverse to a bar or a cross or a square.

7. The semiconductor substrate of claim 1, wherein the grooves of the groove pattern have a width in a range between 50 nm and 5 µm.

8. The semiconductor substrate of claim 1, wherein the groove pattern has a pitch in a range between 100 nm and 10 µm.

9. The semiconductor substrate of claim 1, wherein the grooves of the groove pattern have a depth in a range between 100 nm and 10 µm.

10. The semiconductor substrate of claim 1, wherein the semiconductor substrate is a wafer.

11. The semiconductor substrate of claim 1, wherein the grooves of the groove pattern are completely filled by the epitaxial layer.

12. The semiconductor substrate of claim 1, further comprising voids remaining in the grooves of the groove pattern covered by the epitaxial layer.

13. The semiconductor substrate of claim 1, wherein the surface of the semiconductor base substrate is formed by a surface of an epitaxial layer of the base substrate.

14. The semiconductor substrate of claim 1, wherein the specific crystallographic direction, among all crystallographic directions, provides for the slowest epitaxial growth on the area of the surface of the semiconductor base substrate formed as the groove pattern.

15. The semiconductor substrate of claim 1, wherein the specific crystallographic direction in a cubic lattice is <011>.

16. The semiconductor substrate of claim 1, wherein the semiconductor base substrate is of Si.

17. The semiconductor substrate of claim 1, wherein the semiconductor base substrate is of SiC or GaN.

18. A method of manufacturing a semiconductor substrate, the method comprising:
providing a semiconductor base substrate;
forming an alignment structure on a surface of the semiconductor base substrate by forming a groove pattern in an area of the surface of the semiconductor base substrate, wherein grooves of the groove pattern are aligned with a specific crystallographic direction of the semiconductor base substrate, wherein the specific crystallographic direction provides for a slower epitaxial growth on the area of the surface of the semiconductor base substrate formed as the groove pattern compared to epitaxial growth on a surface of the semiconductor base substrate adjacent to the area of the surface formed as the groove pattern; and
depositing an epitaxial layer on the surface of the semiconductor base substrate formed as the groove pattern.

19. The method of claim 18, further comprising:
aligning a processing tool or an inspection tool with the alignment structure; and
processing or inspecting the epitaxial layer and/or the semiconductor substrate with the processing tool or the inspection tool.

20. The method of claim 19, wherein aligning the processing tool or the inspection tool comprises:
illuminating the epitaxial layer over the alignment structure by visible light;
recognizing side wall edges in the epitaxial layer over the alignment structure, wherein the side wall edges are caused by the slower epitaxial growth over the area of the surface of the semiconductor base substrate formed as the groove pattern during the deposition of the epitaxial layer; and
repositioning the processing tool or the inspection tool based on the recognized side wall edges.

21. The method of claim 20, wherein recognizing side wall edges comprises:
evaluating light reflected by the side wall edges in view of differences in contrast.

22. The method of claim 19, wherein aligning the processing tool or the inspection tool comprises:
illuminating the epitaxial layer over the alignment structure by infrared light;
recognizing the groove pattern of the alignment structure; and
repositioning the processing tool or the inspection tool based on the recognized groove pattern.

23. The method of claim 18, wherein aligning the processing tool comprises repositioning a reticle or the semiconductor substrate in the processing tool.

* * * * *